US012787168B2

(12) United States Patent
Wu et al.

(10) Patent No.: US 12,787,168 B2
(45) Date of Patent: Nov. 3, 2026

(54) ELECTRONIC DEVICE

(71) Applicant: InnoLux Corporation, Miao-Li County (TW)

(72) Inventors: Yuan-Lin Wu, Miao-Li County (TW); Kuang-Pin Chao, Miao-Li County (TW); Kuan-Feng Lee, Miao-Li County (TW); Hao-Jung Huang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 262 days.

(21) Appl. No.: 18/644,090

(22) Filed: Apr. 23, 2024

(65) Prior Publication Data

US 2024/0397620 A1 Nov. 28, 2024

Related U.S. Application Data

(60) Provisional application No. 63/468,802, filed on May 25, 2023.

(30) Foreign Application Priority Data

Feb. 19, 2024 (CN) ........................ 202410182083.4

(51) Int. Cl.
*H05K 1/03* (2006.01)
*H05K 1/02* (2006.01)
(Continued)

(52) U.S. Cl.
CPC ........... *H05K 1/113* (2013.01); *H05K 1/0281* (2013.01); *H05K 1/0393* (2013.01); *H05K 1/181* (2013.01); *H05K 2201/10287* (2013.01)

(58) Field of Classification Search
CPC .... H05K 1/113; H05K 1/0281; H05K 1/0393; H05K 1/181; H05K 2201/10287; H10K 59/131
See application file for complete search history.

(56) References Cited

U.S. PATENT DOCUMENTS 10,561,029 B1 * 2/2020 Yueh ..................... H10W 90/00
2005/0083400 A1 * 4/2005 Hirayama .............. H04N 13/31
348/E13.043
(Continued)

FOREIGN PATENT DOCUMENTS

CN 110972389 A * 4/2020 ........... H05K 1/0218

OTHER PUBLICATIONS

CN-110972389-A Translation (Year: 2020).*

*Primary Examiner* — Timothy J Thompson
*Assistant Examiner* — Aditya Sharma
(74) *Attorney, Agent, or Firm* — Winston Hsu

(57) ABSTRACT

An electronic device including a flexible substrate, a plurality of electronic elements, a plurality of wires and a plurality of electrical connection holes is disclosed. The electronic elements are disposed on the flexible substrate. Three adjacent ones of the electronic elements are arranged as a group to form an electronic unit, such that the plurality of electronic elements form a plurality of electronic units, and four adjacent ones of the electronic units form a unit region that is quadrilateral. The wires are disposed on the flexible substrate. The electrical connection holes are disposed on the flexible substrate. A density of the electrical connection holes in a peripheral portion of the unit region is greater than a density of the electrical connection holes in a central portion of the unit region.

18 Claims, 11 Drawing Sheets

(51) Int. Cl.
*H05K 1/11* (2006.01)
*H05K 1/181* (2026.01)

(56) References Cited

U.S. PATENT DOCUMENTS

| | | | | |
|---|---|---|---|---|
| 2015/0069453 | A1* | 3/2015 | Yamada | H05K 1/189 257/99 |
| 2020/0335711 | A1* | 10/2020 | Zhang | H10K 71/00 |
| 2021/0013242 | A1* | 1/2021 | Guo | H10D 86/60 |
| 2023/0317904 | A1* | 10/2023 | Wu | H10H 20/857 |

* cited by examiner

ELECTRONIC DEVICE

CROSS REFERENCE TO RELATED APPLICATION

This application claims the benefit of U.S. Provisional Application No. 63/468,802, filed on May 25, 2023. The content of the application is incorporated herein by reference.

BACKGROUND OF THE DISCLOSURE

1. Field of the Disclosure

The present disclosure relates to an electronic device, and more particularly to an electronic device including a plurality of electronic elements and electrical connection holes.

2. Description of the Prior Art

There are spacing regions existing between adjacent electronic elements included in an electronic device. Generally, these spacing regions are softer. Therefore, when a product or electronic device is bent, released or subjected to external force in use or during a manufacturing process, it may cause problems such as damage/fracture of connection holes, and/or wiring disconnection easily.

SUMMARY OF THE DISCLOSURE

One of objectives of the present disclosure is to provide an electronic device, wherein through the design of arrangement locations of electrical connection holes and/or disposing reinforcing structures, the probability of damage or fracture of the electrical connection holes may be reduced and/or the probability of damage of electronic elements may be reduced, thereby improving the reliability of the electronic device.

The present disclosure provides an electronic device, which includes a flexible substrate, a plurality of electronic elements, a plurality of wires and a plurality of electrical connection holes. The plurality of electronic elements are disposed on the flexible substrate, wherein three adjacent ones of the plurality of electronic elements are arranged as a group to form an electronic unit such that the plurality of electronic elements form a plurality of electronic units, and four adjacent ones of the plurality of electronic units form a unit region that is quadrilateral. The plurality of wires are disposed on the flexible substrate. The plurality of electrical connection holes are disposed on the flexible substrate. A density of the electrical connection holes in a peripheral portion of the unit region is greater than a density of the electrical connection holes in a central portion of the unit region.

The present disclosure further provides an electronic device, which includes a flexible substrate, a plurality of reinforcing structures and a plurality of electronic elements. The plurality of reinforcing structures are disposed on the flexible substrate, wherein extension lines of outer edges of at least two of the plurality of reinforcing structures form a first region. The plurality of electronic elements are disposed on the flexible substrate, wherein three adjacent ones of the plurality of electronic elements form a second region, and the first region is overlapped with the second region. An area ratio of the first region to the second region is greater than 1 and less than or equal to 9.

These and other objectives of the present disclosure will no doubt become obvious to those of ordinary skill in the art after reading the following detailed description of the embodiment that is illustrated in the various figures and drawings.

DETAILED DESCRIPTION

Figure 1:
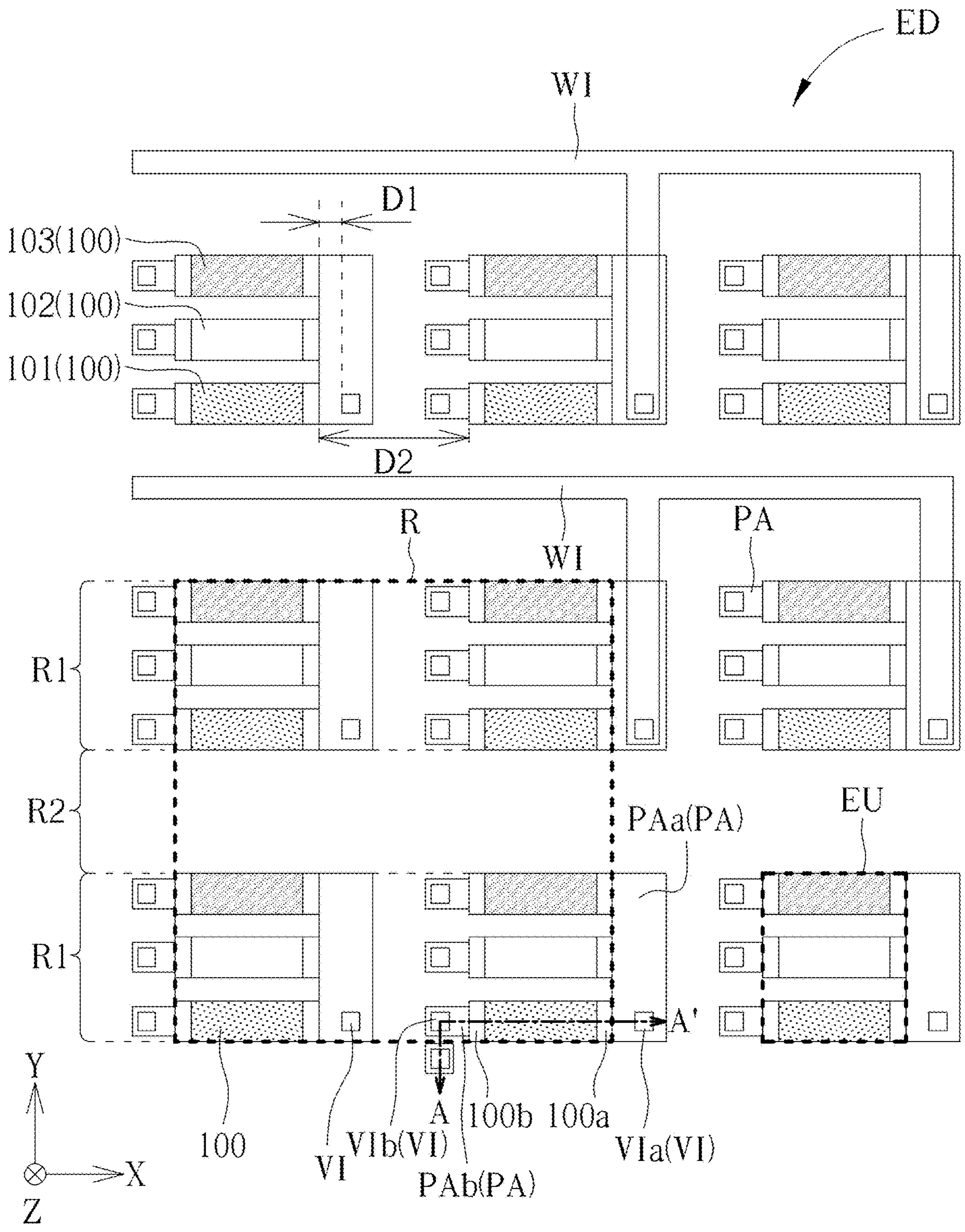
FIG. 1 is a top-view schematic diagram of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device or structure, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". When the terms "include", "comprise" and/or "have" are used in the description of the present disclosure, the corresponding features, areas, steps, operations and/or components would be pointed to existence, but not limited to the existence or addition of one or a plurality of the corresponding or other features, areas, steps, operations, components and/or combinations thereof.

When an element or layer is referred to as being "on" or "connected to" another element or layer, it may be directly on or directly connected to the other element or layer, or intervening elements or layers may be presented (indirect condition). In contrast, when an element is referred to as being "directly on" or "directly connected to" another element or layer, there are no intervening elements or layers presented.

The directional terms mentioned in this document, such as "up", "down", "front", "back", "left", "right", etc., are only directions referring to the drawings. Therefore, the directional terms used are for illustration, not for limitation of the present disclosure.

The terms "about", "equal", "identical" or "the same", and "substantially" or "approximately" mentioned in this document generally mean being within 20% of a given value or range, or being within 10%, 5%, 3%, 2%, 1% or 0.5% of a given value or range.

In the present disclosure, the length, width, thickness, height or area, or the distance or spacing between elements may be measured by an optical microscopy (OM), a scanning electron microscope (SEM), a thin film thickness profiler (α-step), an ellipse thickness gauge or other suitable means. In detail, according to some embodiments, the scanning electron microscope may be used to obtain an image of the cross-sectional structure including to-be-measured elements, and the length, width, thickness, height or area of each element, or the distance or spacing between elements are measured, but not limited herein.

The ordinal numbers used in the description and claims, such as "first", "second", "third", etc., are used to describe elements, but they do not mean and represent that the element(s) have any previous ordinal numbers, nor do they represent the order of one element and another element, or the order of manufacturing methods. The ordinal numbers are used only to clearly discriminate an element with a certain name from another element with the same name. The claims and the description may not use the same terms. Accordingly, in the following description, a first constituent element may be a second constituent element in a claim.

The electronic device of the present disclosure may include a display device, a backlight device, an antenna device, a sensing device or a tiled device, but not limited herein. The electronic device may include a bendable or flexible electronic device. The display device may include a non-self-emissive display device or a self-emissive display device. The electronic device may include, for example, liquid crystals, light emitting devices, fluorescence, phosphors, quantum dots (QDs), other suitable display media or combinations of the above. The antenna device may include a liquid-crystal type antenna device or a varactor diode antenna device, and the sensing device may include a sensing device used for sensing capacitance, light, heat or ultrasonic waves, but not limited herein. In the present disclosure, the electronic device may include electronic elements such as passive elements and active elements, for example, capacitors, resistors, inductors, diodes, transistors, etc. The diode may include a light-emitting diode, a varactor diode or a photodiode, but not limited herein. For example, the light-emitting diode may include an organic light-emitting diode (OLED), a mini light-emitting diode (mini LED), a micro light-emitting diode (micro LED) or a quantum dot light-emitting diode (quantum dot LED), but not limited herein. The tiled device may be, for example, a display tiled device or an antenna tiled device, but not limited herein. It should be noted that the electronic device may be any arrangement and combination of the above, but not limited herein. In addition, the appearance of the electronic device may be a rectangle, a circle, a polygon, a shape with curved edges or other suitable shapes. The electronic device may have a peripheral system such as a driving system, a control system, a light source system, etc., to support a display device, an antenna device, a wearable device (including augmented reality or virtual reality, for example), a vehicle-mounted device (including an automobile windshield, for example) or a tiled device.

It should be noted that the technical features in different embodiments described in the following can be replaced, recombined, or mixed with one another to constitute another embodiment without departing from the spirit of the present disclosure.

Figure 2:
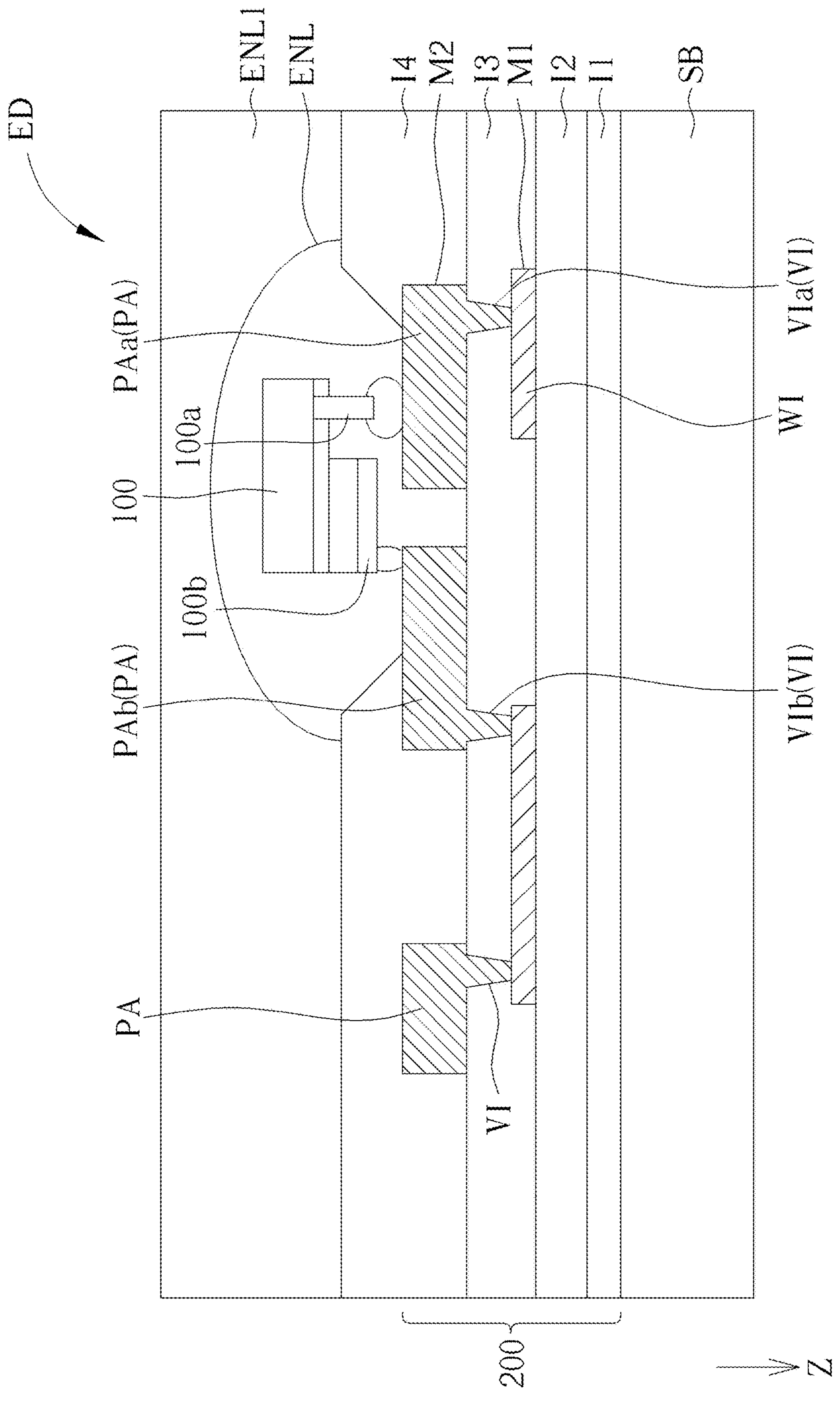
FIG. 2 is a partial cross-sectional schematic diagram of an electronic device according to an embodiment of the present disclosure.

Please refer to FIG. 1 and FIG. 2. FIG. 1 is a top-view schematic diagram of an electronic device according to a first embodiment of the present disclosure. FIG. 2 is a partial cross-sectional schematic diagram of an electronic device according to an embodiment of the present disclosure. The partial cross-sectional structure of an electronic device ED corresponding to the section line A-A' in FIG. 1 may be referred to FIG. 2. As shown in FIG. 1 and FIG. 2, an electronic device ED includes a flexible substrate SB, a plurality of electronic elements 100, a plurality of wires WI and a plurality of electrical connection holes VI. In order to simplify the drawing, FIG. 1 only schematically shows a portion of the wires WI. The flexible substrate SB may include flexible material such as polyimide (PI), polycarbonate (PC), polyethylene terephthalate (PET) or poly(methyl methacrylate) (PMMA), but not limited herein. The plurality of electronic elements 100 are disposed on the flexible substrate SB. The electronic elements 100 may include passive elements and/or active elements, such as capacitors, resistors, inductors, diodes, transistors, etc. The diode may include a light-emitting diode, a photodiode or a varactor diode. For example, the light-emitting diode (LED) may include an organic light-emitting diode (OLED), a mini light-emitting diode (mini LED), a micro light-emitting diode (micro LED) or a quantum dot light-emitting diode (quantum dot LED), but not limited herein.

Three adjacent ones of the plurality of electronic elements 100 are arranged as a group to form an electronic unit EU, such that the plurality of electronic elements 100 form a plurality of electronic units EU. According to the embodiment shown in FIG. 1, the plurality of electronic units EU may be arranged in a plurality of horizontal rows extending along a direction X and a plurality of straight columns extending along a direction Y on the flexible substrate SB, for example (but not limited to) arranged in an array, wherein the direction X is different from the direction Y. For example, the direction X may be perpendicular to the direction Y. In some embodiments, one electronic unit EU may include a first electronic element 101, a second electronic element 102, and a third electronic element 103, which may, for example, generate different colors of light respectively. For example, the first electronic element 101 may be a red light-emitting element, the second electronic element 102 may be a green light-emitting element, and the third electronic element 103 may be a blue light-emitting element, but the present disclosure is not limited herein. The color of light generated by the first electronic element 101, the second electronic element 102 and the third electronic element 103 are not limited to the above, or the first electronic element 101, the second electronic element 102 and the third electronic element 103 may have other functions respectively. The functions of each electronic element 100 may include, for example, emitting light, receiving light, controlling circuits and/or adjusting electromagnetic waves, but not limited herein. When the electronic device ED has a display function, one electronic unit EU composed of three adjacent electronic elements 100 may serve as a pixel. That is to say, one pixel may include a first electronic element 101, a second electronic element 102 and a third electronic element 103, for example.

Four adjacent ones of the plurality of electronic units EU form a unit region R that is quadrilateral. The unit region R referred in the present disclosure is the smallest quadrilateral that is able to surround four adjacent electronic units EU, which may be, for example, a square, a rectangle, a parallelogram, etc. Taking the electronic device ED shown in FIG. 1 as an example, the extension lines of the edges closer to the outside of the plurality of electronic elements 100 in four adjacent electronic units EU may form the unit region R, but not limited herein. The unit region R includes a peripheral portion R1 and a central portion R2. The central portion R2 may be a portion of the unit region R that is not overlapped with the electronic elements 100 (or the electronic unit EU) in a direction Z, and the peripheral portion R1 may be a portion of the unit region R that is overlapped with the electronic elements 100 in the direction Z. The direction Z may be a normal direction of the electronic device ED and may be parallel to a top-view direction of the electronic device ED and a normal direction of the surface of the flexible substrate SB. That is to say, the direction Z may be perpendicular to a top surface or a bottom surface of the flexible substrate SB, and the direction X and the direction Y may be perpendicular to the direction Z respectively. For example, the extension lines of the edges closer to the center of the plurality of electronic elements 100 in the unit region R may form the central portion R2, and the peripheral portion R1 may be located at the upper and lower sides of the central portion R2 and is a portion other than the central portion R2, but not limited herein.

The plurality of wires WI are disposed on the flexible substrate SB, and the plurality of electrical connection holes VI are disposed on the flexible substrate SB. Specifically, according to the embodiment shown in FIG. 2, the electronic device ED may further include layers and elements disposed on the flexible substrate SB, such as at least one insulating layer (e.g., an insulating layer I1, an insulating layer I2 and an insulating layer I3 shown in FIG. 2 and an insulating layer I0 shown in FIG. 6), at least one conductive layer (e.g., a conductive layer M1 and a conductive layer M2 shown in FIG. 2 and a conductive layer M0 shown in FIG. 6), a thin film transistor (e.g. a thin film transistor TFT shown in FIG. 6, FIG. 9 or FIG. 10), etc., so as to form a circuit layer 200. The circuit layer 200 may include, for example (but not limited to), a redistribution layer (RDL) for redistributing the circuit. The plurality of wires WI may be formed of one or more conductive layers. For example, at least one of the wires WI may be formed of the conductive layer M1, but not limited herein. The plurality of electrical connection holes VI may be through holes formed in one or more insulating layers, and conductive material is filled in each electrical connection hole VI. The conductive material may include, for example (but not limited to), copper, aluminum, titanium, gallium, tantalum, transparent conductive material, other suitable materials or combinations of the above materials. Each electrical connection hole VI filled with the conductive material may be electrically connected to at least one of the wires WI. For example, the plurality of electrical connection holes VI may be used to electrically connect the electronic elements 100 with the wires WI, one of the wires WI with another one of the wires WI and/or the wires WI with other elements or devices. As shown in FIG. 1 and FIG. 2, the plurality of electronic elements 100 may be electrically connected to the plurality of wires WI through at least one of the plurality of electrical connection holes VI respectively. For example, the electronic device ED may further include a plurality of conductive pads PA, and the plurality of conductive pads PA may be formed of the conductive layer M2 located at the uppermost layer in the circuit layer 200. Furthermore, the electronic element 100 may include a first electrode 100*a* and a second electrode 100*b*, the first electrode 100*a* may be electrically connected to one of the wires WI through one conductive pad PAa of the conductive pads PA and one electrical connection hole VIa of the electrical connection holes VI, and the second electrode 100*b* may be electrically connected to another one of the wires WI through another conductive pad PAb of the conductive pads PA and another electrical connection hole VIb of the electrical connection holes VI, but the present disclosure is not limited to the above. In other embodiments, the second electrode 100*b* may be electrically connected to the wire WI through a plurality of electrical connection holes VIb, so that when one of the electrical connection holes VIb is abnormal, the second electrode 100*b* of the electronic element 100 can still be electrically connected to the wire WI through other normal electrical connection holes VIb. In some embodiments, the conductive pad PAa may serve as a common electrode. For example, the first electronic element 101, the second electronic element 102 and the third electronic element 103 may be electrically connected to the conductive pad PAa respectively. Furthermore, the conductive pad PAb may serve as a pixel electrode, but not limited herein.

As shown in FIG. 1, a density of the electrical connection holes VI in a peripheral portion R1 of the unit region R is greater than a density of the electrical connection holes VI in a central portion R2 of the unit region R, wherein the plurality of electrical connection holes VI may be disposed adjacent to the plurality of electronic elements 100. That is to say, the plurality of electrical connection holes VI are disposed adjacent to one of the plurality of electronic elements 100 respectively, and the number of electrical connection holes VI per unit area in the region close to the electronic element 100 may be greater than the number of electrical connection holes VI per unit area in the region far away from the electronic element 100. According to the above structure, by disposing the electrical connection holes VI in the region adjacent to the electronic elements 100, this region deforms less easily than other regions on the flexible substrate SB, such that the probability of damage or fracture of the electrical connection holes VI may be reduced, thereby improving the reliability of the electronic device ED. According to the embodiment shown in FIG. 1, the central portion R2 may not be provided with the electrical connection holes VI, but the present disclosure is not limited to the above. In other embodiments, the electrical connection holes VI may be disposed in the central portion R2, but the density of the electrical connection holes VI in the peripheral portion R1 of the unit region R is still maintained to be greater than the density of the electrical connection holes VI in the central portion R2 of the unit region R.

In some embodiments, as shown in FIG. 1, as shown in FIG. 1, the flexible substrate SB of the electronic device ED may have a bending axis extending along the direction X, so that the electronic device ED is able to be bent in the direction Y, or the electronic device ED may be subjected to stress or external force along the direction Y when the electronic device ED is in use or in a manufacturing process of the electronic device ED (e.g., a bonding process, a release process, etc.). According to the embodiment shown in FIG. 1, the central portion R2 may be a portion of the unit region R that extends along the direction X and is not overlapped with the electronic element 100 (or the electronic unit EU) in the direction Z, the peripheral portion R1 may be a portion of the unit region R that extends along the direction X and is overlapped with the electronic elements 100 in the direction Z, and the plurality of electrical connection holes VI may be disposed adjacent to the electronic elements 100 in the direction X. Specifically, in the direction X, a shortest distance between one of the plurality of electronic units EU and an adjacent one of the plurality of electrical connection holes VI is defined as a first distance D1, and a shortest distance between the above one of the plurality of electronic units EU and another one of the plurality of electronic units EU adjacent to the above one of the plurality of electronic units EU is defined as a second distance D2, wherein the first distance D1 is less than or equal to two thirds of the second distance D2 (i.e., $D1 \leq D2*2/3$), such that the electrical connection hole VI is disposed adjacent to the electronic element 100, thereby reducing the probability of damage of the electrical connection hole VI.

In some embodiments, as shown in FIG. 1, the electronic device ED may further include an insulating layer I4 disposed on the circuit layer 200, and the insulating layer I4 may have a plurality of openings respectively corresponding to at least one of the plurality of electronic elements 100. For example, the insulating layer I4 may serve as a pixel definition layer (PDL), but not limited herein. Each insulating layer in the present disclosure (e.g., the insulating layer I1, the insulating layer I2, the insulating layer I3 and the insulating layer I4 shown in FIG. 2 and the insulating layer I0 shown in FIG. 6) may include organic material, inorganic material, dielectric material, other suitable insulating materials or combinations of the above materials, such as polyimide, epoxy, silicon nitride (SiNx), silicon oxide (SiOx) or silicon oxynitride (SiNxOy). Each conductive layer in the disclosure (e.g., the conductive layer M1 and the conductive layer M2 shown in FIG. 2, the conductive layer M0 shown in FIG. 6 and the conductive layer M3 shown in FIG. 9) may include metal material or transparent conductive material. The metal material includes, for example, copper, aluminum, titanium, gallium, tantalum, other suitable materials or combinations of the above materials, and the transparent conductive material includes, for example, indium tin oxide (ITO), but not limited herein. In some embodiments, the electronic device ED may further include an encapsulation layer ENL partially disposed on the electronic elements 100, which may be used for protecting the electronic elements 100, so as to reduce the damage of the electronic elements 100. The electronic device ED may further include an encapsulation layer ENL1 disposed on the insulating layer I4 and the electronic elements 100, so as to isolate moisture and/or air. The encapsulation layer ENL and the encapsulation layer ENL1 may include organic resin, epoxy, epoxy molding compound (EMC), ceramics, poly(methyl methacrylate) (PMMA), polydimethylsiloxane (PDMS), other suitable materials or combinations of the above materials, but not limited herein.

Some embodiments of the electronic devices of the present disclosure will be detailed in the following. In order to simplify the illustration, the same elements in the following would be labeled with the same symbols. The differences between different embodiments are described in detail below, and the same features would not be described redundantly.

Figure 3:
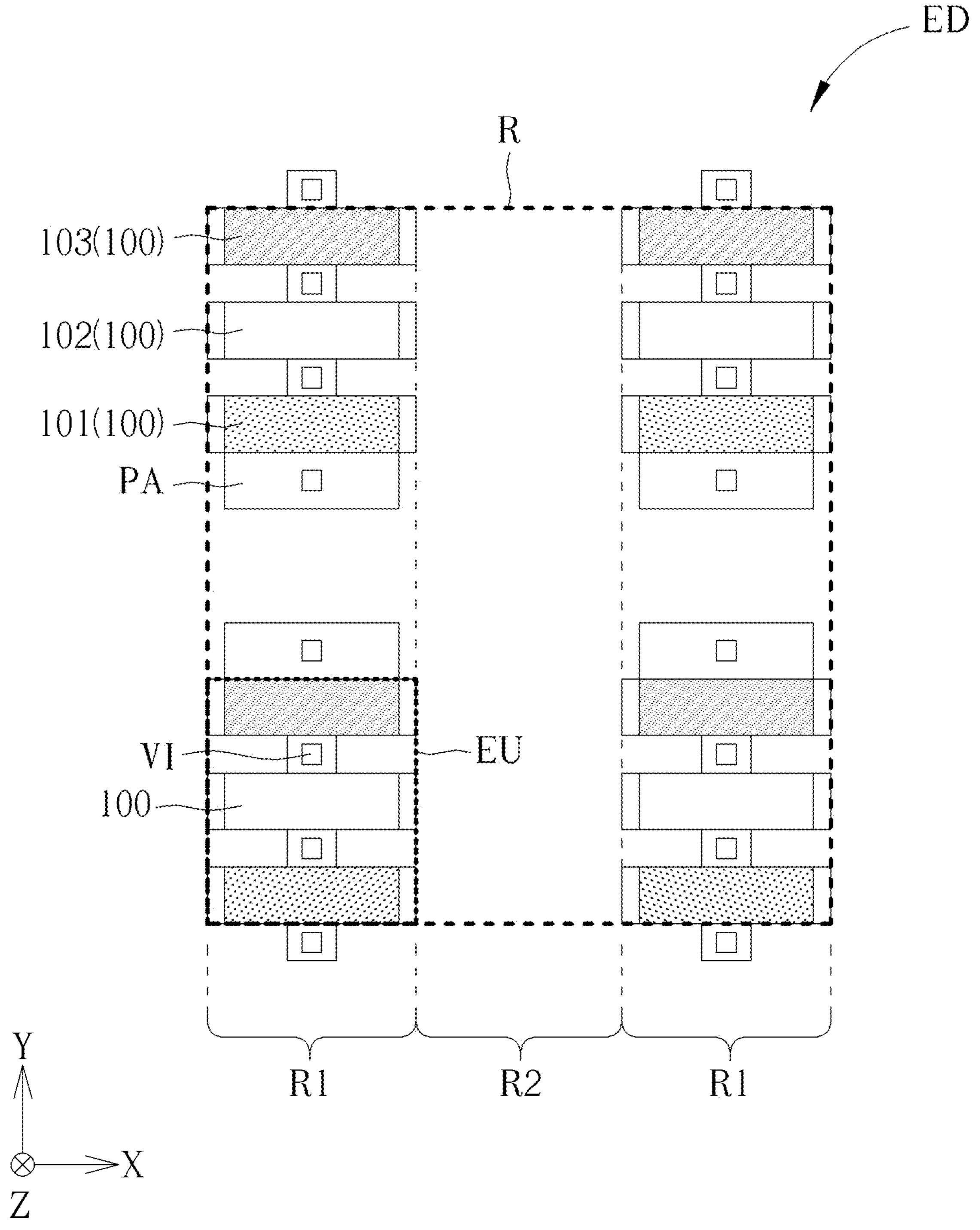
FIG. 3 is a partial top-view schematic diagram of an electronic device according to a second embodiment of the present disclosure.

Please refer to FIG. 3, which is a partial top-view schematic diagram of an electronic device according to a second embodiment of the present disclosure. As shown in FIG. 3, in some embodiments, the flexible substrate SB of the electronic device ED may have a bending axis extending along the direction Y, so that the electronic device ED is able to be bent in the direction X, or the electronic device ED may be subjected to stress or external force along the direction X when the electronic device ED is used or in a manufacturing process of the electronic device ED (e.g., a bonding process, a release process, etc.). According to the embodiment shown in FIG. 3, the central portion R2 may be a portion of the unit region R that extends along the direction Y and is not overlapped with the electronic element 100 (or the electronic unit EU) in the direction Z, and the peripheral portion R1 may be a portion of the unit region R that extends along the direction Y and is overlapped with the electronic elements 100 in the direction Z. The extension lines of the edges closer to the center of the plurality of electronic elements 100 in the unit region R may form the central portion R2, and the peripheral portion R1 may be located at the left and right sides of the central portion R2 and is a portion other than the central portion R2. Furthermore, the plurality of electrical connection holes VI may be disposed adjacent to the electronic elements 100 in the direction Y, such that the probability of damage or fracture of the electrical connection holes VI may be reduced, thereby improving the reliability of the electronic device ED.

Figure 4A:
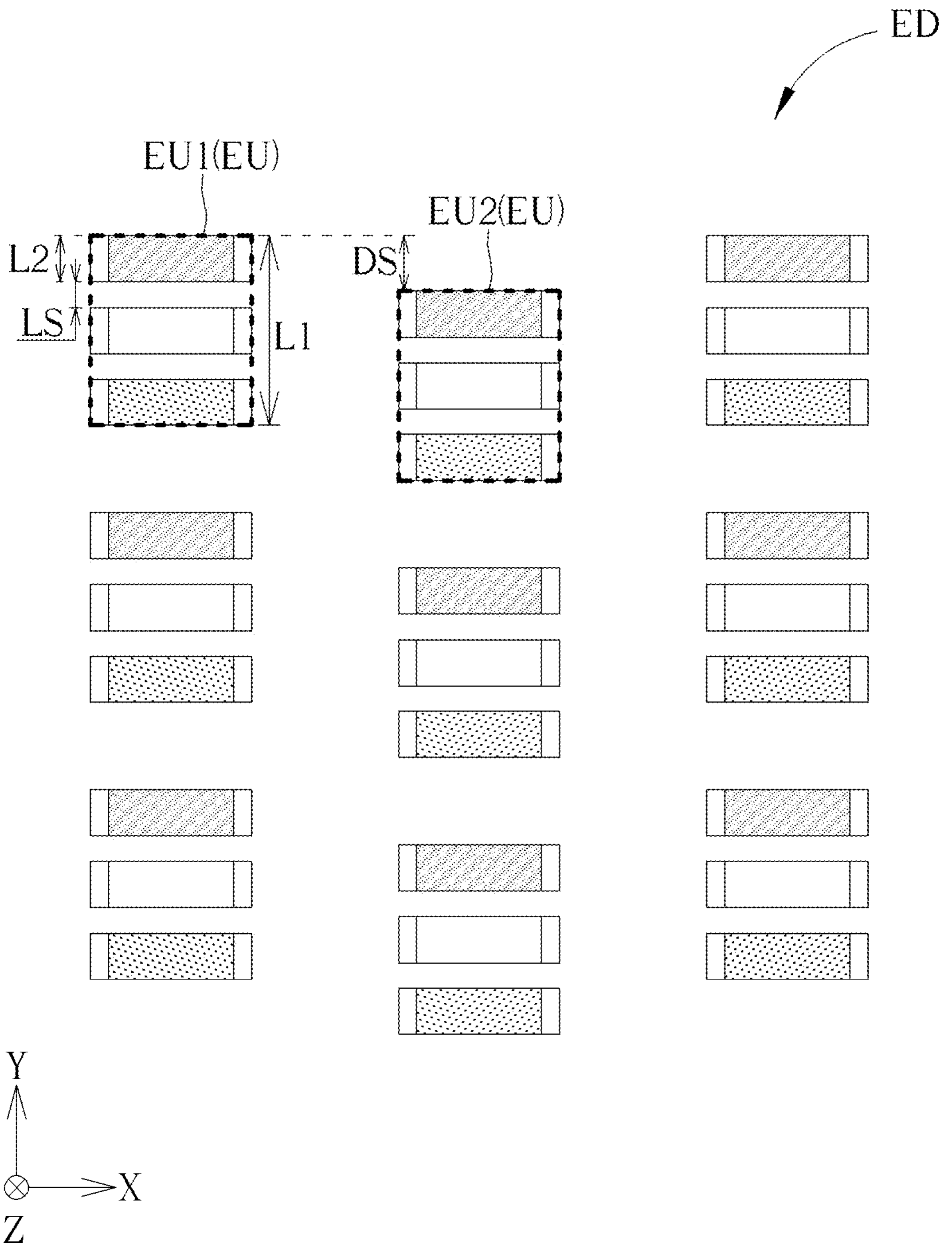
FIG. 4A and FIG. 4B are top-view schematic diagrams of some embodiments according to an electronic device of the present disclosure.
Figure 4B:
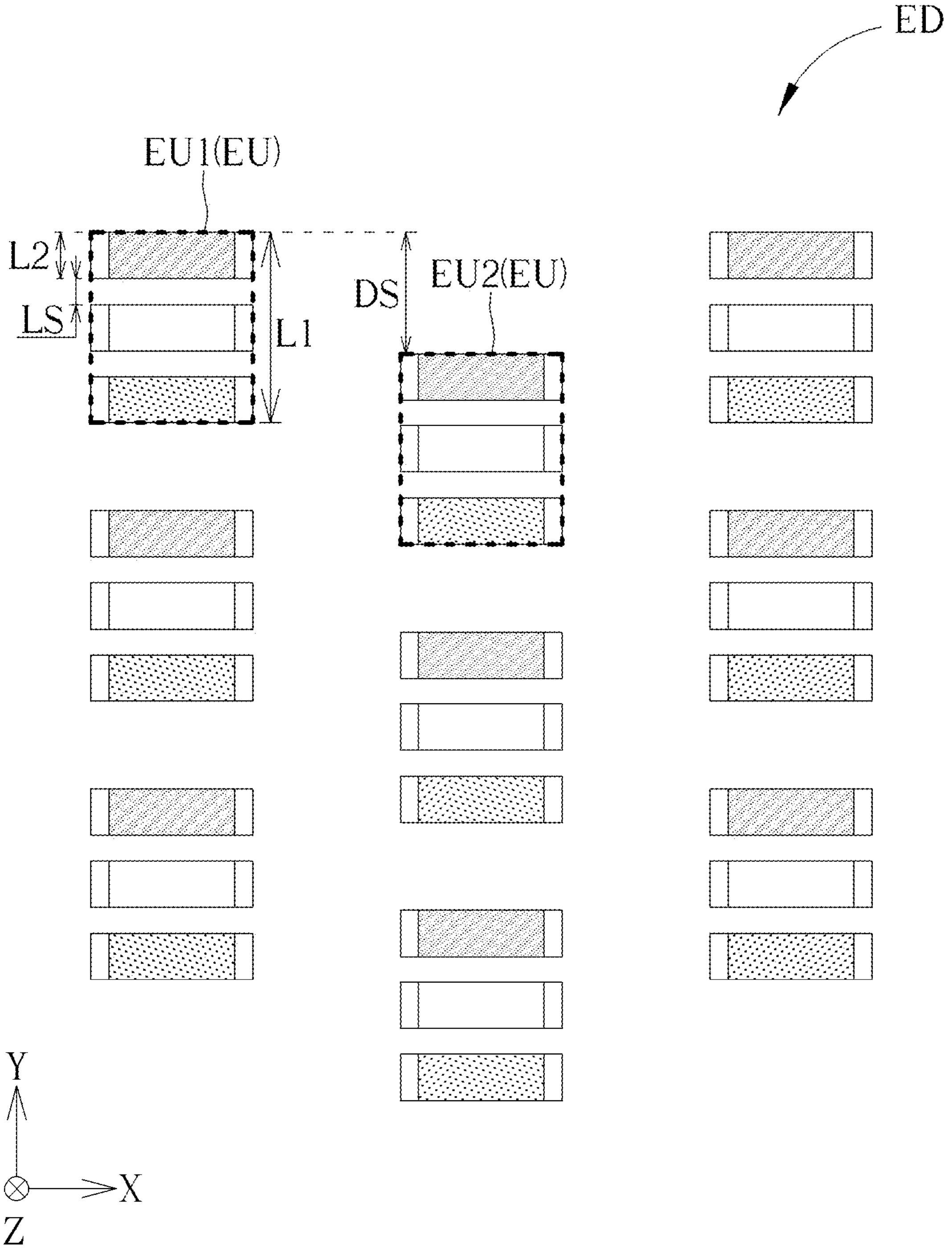

Please refer to FIG. 4A and FIG. 4B. FIG. 4A and FIG. 4B are top-view schematic diagrams of some embodiments according to an electronic device of the present disclosure. As shown in FIG. 4A and FIG. 4B, in some embodiments, when the electronic device ED is bent in the direction Y or subjected to stress or external force along the direction Y, the electronic units EU in two adjacent columns may be vertically shifted with an shifting distance DS therebetween. Specifically, the plurality of electronic units EU may include a first electronic unit EU1 located in the first column and a second electronic unit EU2 located in the second column. The first electronic unit EU1 and the second electronic unit EU2 are adjacent to each other in the direction X and have the shifting distance DS in the direction Y, and the first electronic unit EU1 (or the second electronic unit EU2) has a first length L1 in the direction Y, wherein the shifting distance DS is greater than or equal to 0.2 times of the first length L1 and less than or equal to 0.5 times of the first length L1 (i.e., $0.2*L1 \leq DS \leq 0.5*L1$). FIG. 4A shows a small shifting distance DS within the above range, while FIG. 4B shows a large shifting distance DS within the above range. According to the embodiment shown in FIG. 4A and FIG. 4B, the region located between adjacent electronic elements 100 in the direction Y and extending along the direction X with no electronic element 100 disposed, is an area where the wires disposed thereon are easily to break, called as a wire-easy-to-break area. Through the above shifting design of the electronic units EU, the wire-easy-to-break area may be dispersed instead of extending from one end of the electronic device ED to the other end thereof along the direction X, such that the probability of wire breakage and/or expanding of the fracture range of the wire is reduced. If the shifting distance DS exceeds the above range, the reliability of the electronic device may be affected. For example, the wire-easy-to-break area is not dispersed enough to contribute to reducing the probability of wire breakage when the shifting distance DS is too small, while the vacant region may take up too much space and cause poor visual effect when the shift distance DS is too large.

According to the embodiment shown in FIG. 4A and FIG. 4B, in the direction Y, the plurality of electronic elements 100 of the first electronic unit EU1 (or the second electronic unit EU2) has a second length L2 respectively, and a spacing LS exists between two adjacent ones of the plurality of electronic elements 100 of the first electronic unit EU1 (or the second electronic unit EU2), wherein the shifting distance DS is not equal to N times of a sum of the second length L2 and the spacing LS (i.e., DS≠N*(L2+LS)), and N is a positive integer. The wire-easy-to-break area is dispersed through the above limitation of the range of the shifting distance DS. When the shifting distance DS is equal to N times of the sum of the second length L2 and the spacing LS, the wire-easy-to-break area may still extend from one end of the electronic device ED to the other end thereof along the direction X as a whole, so that the wire-easy-to-break area cannot be dispersed.

Figure 5:
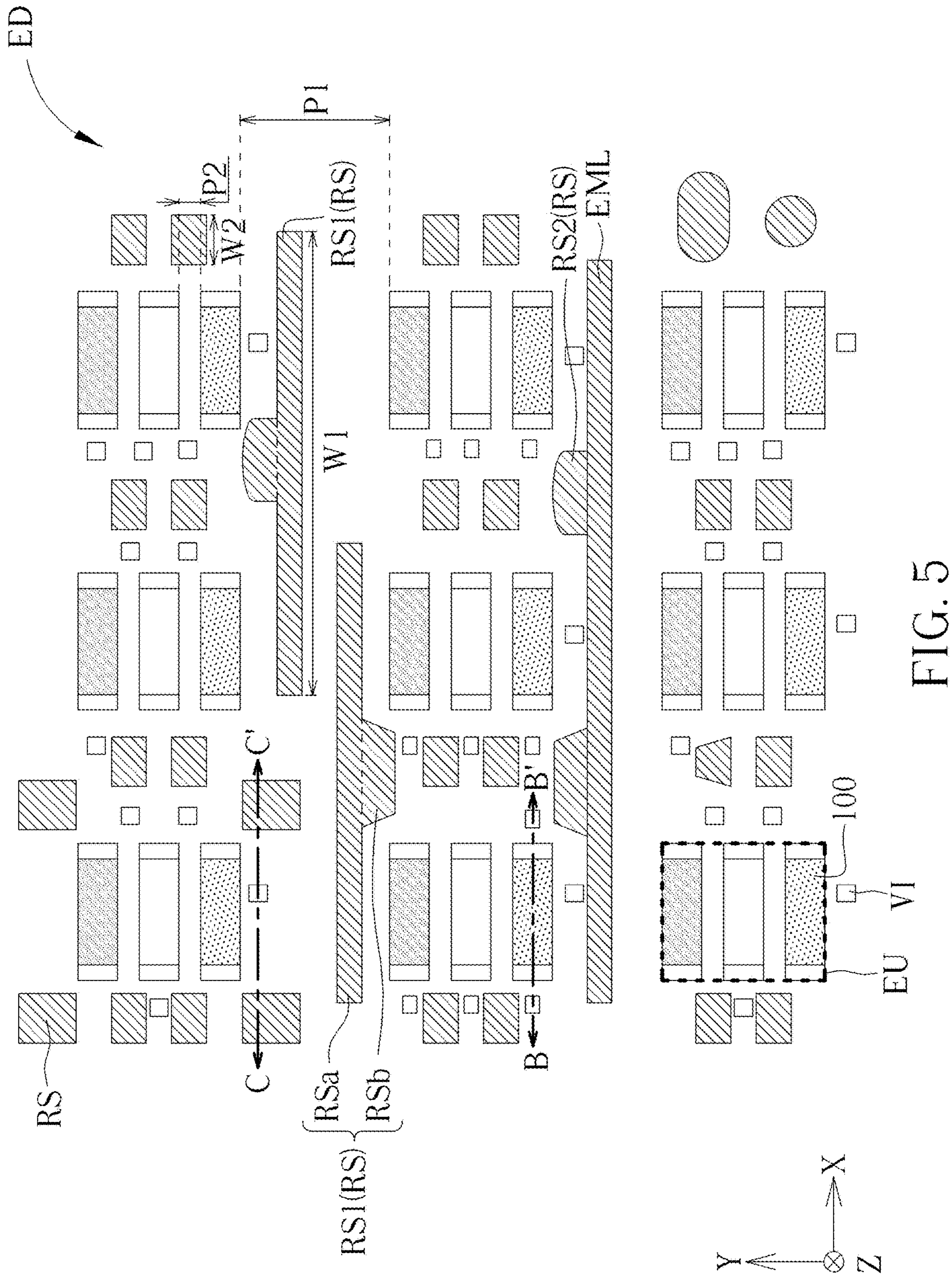
FIG. 5 is a top-view schematic diagram of an electronic device according to a third embodiment of the present disclosure.
Figure 6:
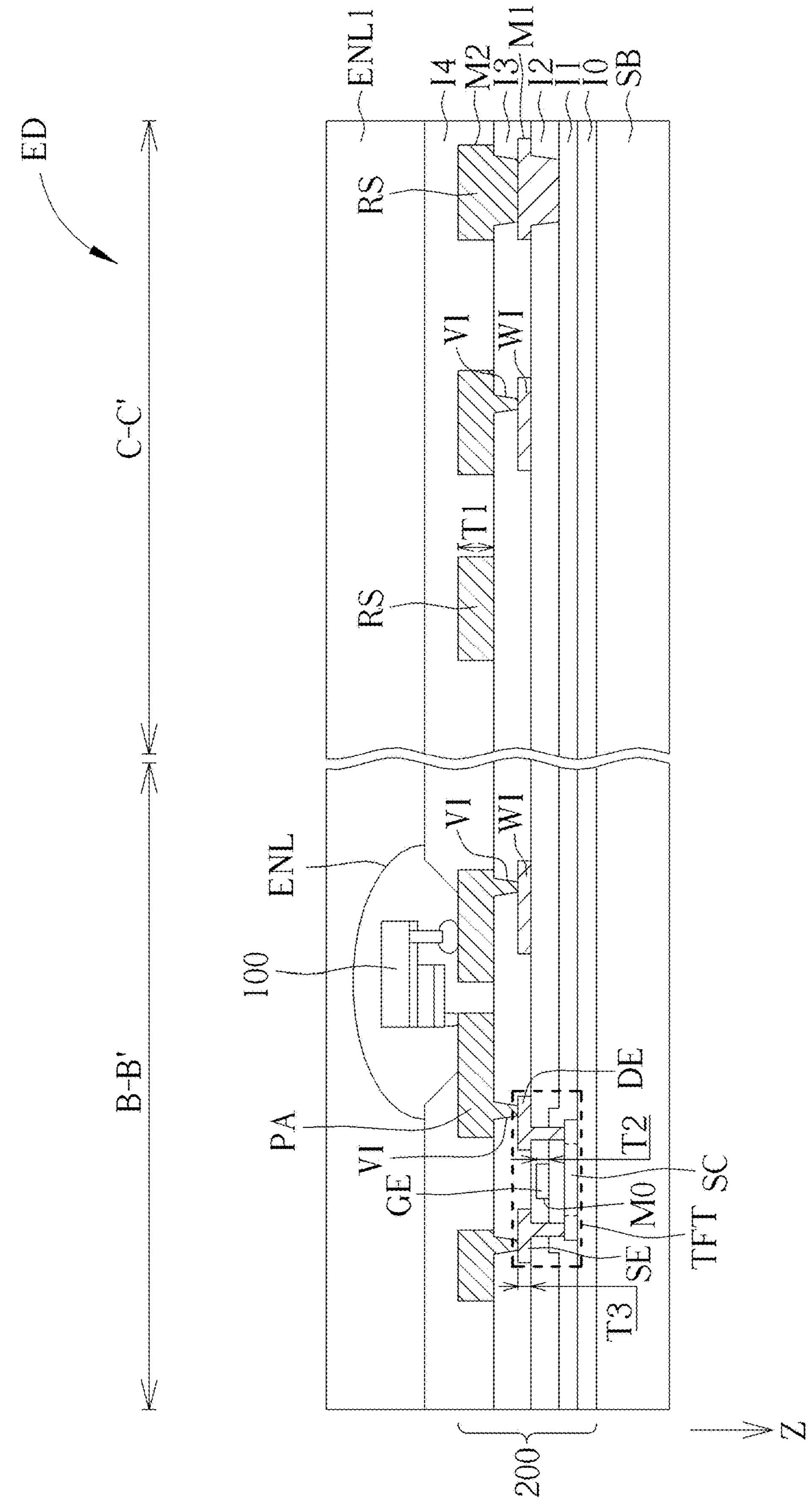
FIG. 6 is a partial cross-sectional schematic diagram of an electronic device according to an embodiment of the present disclosure.

Please refer to FIG. 5 and FIG. 6. FIG. 5 is a top-view schematic diagram of an electronic device according to a third embodiment of the present disclosure. FIG. 6 is a partial cross-sectional schematic diagram of an electronic device according to an embodiment of the present disclosure. The partial cross-sectional structure of an electronic device ED corresponding to the section line B-B' and the section line C-C' in FIG. 5 may be referred to FIG. 6. According to the embodiment shown in FIG. 5 and FIG. 6, the electronic device ED may further include a plurality of reinforcing structures RS disposed on the flexible substrate SB. The plurality of reinforcing structures RS are disposed adjacent to at least one of the plurality of electronic elements 100 respectively, and the plurality of electrical connection holes VI may further be disposed adjacent to at least one of the plurality of reinforcing structures RS respectively. The reinforcing structure RS may increase the strength of the region where it is located and/or make the overall stress more uniform, thereby reducing the possibility of damage of the region where the reinforcing structure RS is located and the electronic elements 100 and the electrical connection holes VI adjacent to the reinforcing structure RS when the electronic device ED is bent and/or subjected to stress. Each reinforcing structure RS may have different shape designs. In the top-view along the direction Z, the reinforcing structure RS may be, for example (but not limited to), a quadrilateral, a circle, a trapezoid, a polygon with arc angles, a structure with a protruding portion or other suitable shapes. The reinforcing structure RS may include metal material, non-metal material, insulating material, resin material, composite material or other suitable materials.

As shown in FIG. 5, in some embodiments, the plurality of reinforcing structures RS may include a reinforcing structure RS1, and the reinforcing structure RS1 may have an extending portion RSa and a protruding portion RSb protruding from the extending portion RSa. The extension direction of the extending portion RSa may be parallel to the long-axis direction X of the adjacent electronic element 100, and the protruding portion RSb protrudes from the extending portion RSa in a direction parallel to the direction Y, wherein the extension range of the extending portion RSa in the direction X may exceed more than two electronic units EU. In some embodiments, in the direction Y, a spacing P1 exists between two adjacent electronic elements 100, and a spacing P2 exists between further two adjacent electronic elements 100. When the spacing P1 is greater than the spacing P2, the maximum width in the direction X of the reinforcing structure RS (e.g., the reinforcing structure RS1) which is disposed adjacent to the two adjacent electronic elements 100 having the spacing P1 is defined as a width W1, and the maximum width in the direction X of the reinforcing structure RS which is disposed adjacent to the further two adjacent electronic elements 100 having the spacing P2 is defined as a width W2, wherein the width W1 is greater than the width W2, which may contribute to reduce the probability of element or structure damage.

As shown in FIG. 5, in some embodiments, the electronic device ED may further include an extension metal line EML disposed on the flexible substrate SB. The extension direction of the extension metal line EML may be parallel to the direction X, wherein the extension range of the extension metal line EML may exceed, for example (but not limited to), more than 10 electronic units EU. Furthermore, the plurality of reinforcing structures RS may include a reinforcing structure RS2 that is in contact with the extension metal line EML. That is to say, in the top-view along the direction Z, the reinforcing structure RS2 may be a portion that protrudes with respect to the horizontal line of the extension metal line EML in a direction parallel to the direction Y.

As shown in FIG. 6, in some embodiments, the reinforcing structures RS may be coplanar with the conductive pads PA. For example, the reinforcing structure RS and the conductive pad PA may include the same metal material or may be formed of the same conductive layer M2. The formed reinforcing structure RS may have a floating potential or be a dummy metal, or the formed reinforcing structure RS may be connected to a common electrode, a crack sensing electrode or a touch electrode disposed on the flexible substrate SB, but not limited herein. A thickness T1 of each reinforcing structure RS in the direction Z may be greater than the thickness of any of the conductive layers located therebelow (e.g., the conductive layer M1 and the conductive layer M0). For example, the electronic device ED may include a thin film transistor TFT disposed on the flexible substrate SB, and the thin film transistor TFT may serve as, for example (but not limited to), a driving element or a switching element and be electrically connected to the electronic element 100. Furthermore, the thin film transistor TFT may include a gate GE, a drain DE, a source SE and a semiconductor layer SC. The gate GE may be formed of a portion of the conductive layer M0 in the circuit layer 200, and the drain DE and the source SE may be formed of a portion of the conductive layer M1 in the circuit layer 200, wherein the locations of the drain DE and the source SE may be exchanged in other embodiments. The insulating layer I1 exists between the gate GE and the semiconductor layer SC, so as to serve as a gate dielectric layer, and the region of the semiconductor layer SC overlapped with the gate GE may serve as a channel region of the thin film transistor TFT. In the direction Z, the thickness T1 of the reinforcing structure RS may be greater than a thickness T2 of the gate GE, and the thickness T1 of the reinforcing structure RS may be greater than a thickness T3 of the drain DE and/or the source SE. In some embodiments, the Young's modulus of the reinforcing structure RS may be greater than the Young's modulus of the conductive layer M0 (or the gate GE) and greater than that of the conductive layer M1 (or the drain DE and the source SE). In some embodiments, the material of the reinforcing structure RS may be different from the material of the conductive layer M0 (or the gate GE) and the material of the conductive layer M1 (or the drain DE and the source SE). For example, the reinforcing structure RS may include copper or composite material composed of titanium/ copper, nickel/copper, titanium/copper/titanium, molybdenum/copper, and the material of the conductive layer M0 and the conductive layer M1 may include aluminum or composite material composed of molybdenum/aluminum/molybdenum, but not limited herein.

Figure 7:
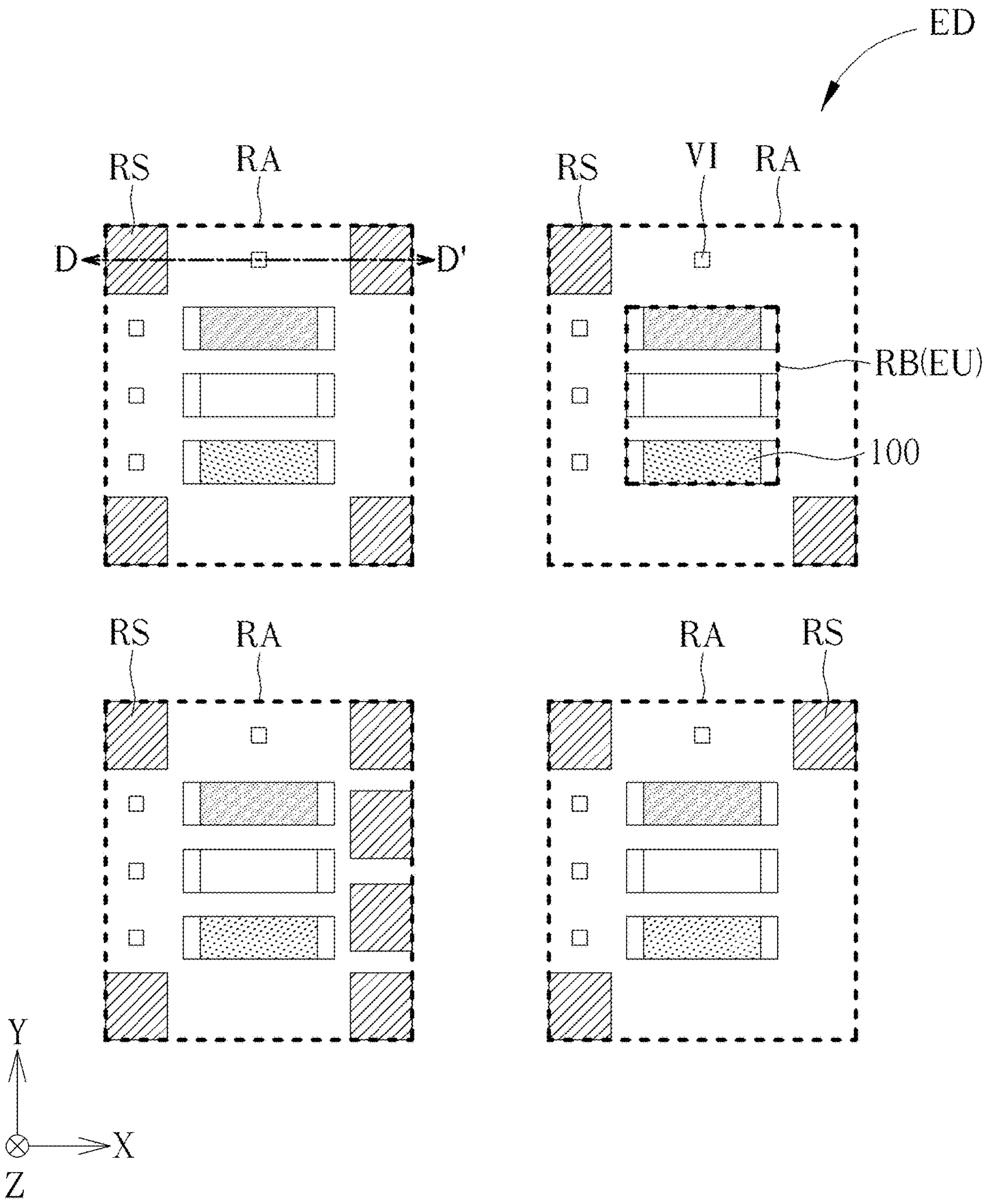
FIG. 7 is a top-view schematic diagram of an electronic device according to a fourth embodiment of the present disclosure.

Please refer to FIG. 7, which is a top-view schematic diagram of an electronic device according to a fourth embodiment of the present disclosure. The partial cross-sectional structure of an electronic device ED corresponding to the section line D-D' in FIG. 7 may be referred to the cross-sectional structure shown in the right side of FIG. 2. According to the electronic device ED of the fourth embodiment shown in FIG. 7, the plurality of reinforcing structures RS are disposed on the flexible substrate SB (shown in FIG. 6), and extension lines of outer edges of at least two of the plurality of reinforcing structures RS may form a first region RA, wherein the first region RA may surround the above least two reinforcing structures RS. FIG. 7 shows that the extension lines of the outer edges of two, three, four and six reinforcing structures RS may respectively form the first region RA as examples, but the number of the reinforcing structures RS surrounded by the first region RA of the present disclosure is not limited to the above. The plurality of electronic elements 100 are disposed on the flexible substrate SB, and three adjacent ones of the plurality of electronic elements 100 may form a second region RB. For example, the extension lines of the outer edges of three adjacent electronic elements 100 may form the second region RB. In some embodiment, three adjacent ones of the plurality of electronic elements 100 may be arranged as a group to form an electronic unit EU, such that the plurality of electronic elements 100 form a plurality of electronic units EU, and the region of each electronic unit EU may be regarded as the second region RB. As shown in FIG. 7, in the direction Z, the first region RA is overlapped with the second region RB, and an area ratio of the first region RA to the second region RB is greater than 1 and less than or equal to 9 (i.e., $1<RA/RB\leq 9$). The second region RB is located within the first region RA, and the arrangement positions of the reinforcing structures RS are located within the range which is 9 times of the second region RB, so that the plurality of reinforcing structures RS are respectively disposed adjacent to at least one of the plurality of electronic elements 100, so as to increase the strength of the region where the reinforcing structures RS are disposed and/or make the overall stress more uniform. The shapes and material of the reinforcing structures RS may be referred to the previous embodiments, which will not be redundantly described herein.

According to the embodiment shown in FIG. 7, in the top-view along the direction Z, each of the reinforcing structures RS may have an area A1 respectively, each of the electronic elements 100 may have an area A2 respectively, and a ratio of the area A1 of one of the plurality of reinforcing structures RS to the area A2 of one of the plurality of electronic elements 100 is greater than or equal to 0.15 and less than or equal to 3 (i.e., $0.15\leq A1/A2\leq 3$), wherein the selected reinforcing structure RS is adjacent to the selected electronic element 100. According to the design of the above area ratio, the probability that the electronic element 100 adjacent to the reinforcing structure RS is damaged when the electronic device ED is bent and/or subjected to stress may be effectively reduced. In some embodiments, the above ratio of the area A1 to the area A2 may be greater than or equal to 0.25 and less than or equal to 2.5 (i.e., $0.25\leq A1/A2\leq 2.5$), or the above ratio may be greater than or equal to 0.5 and less than or equal to 2 (i.e., $0.5\leq A1/A2\leq 2$). If the ratio of the area A1 to the area A2 exceeds the above range, the quality of the electronic device may be affected. For example, the effect of inhibiting the damage or fracture of the electronic elements is poor when the above ratio is too small, while it may take up too much space and is disadvantageous to the bending of the electronic device when the ratio is too large.

Figure 8:
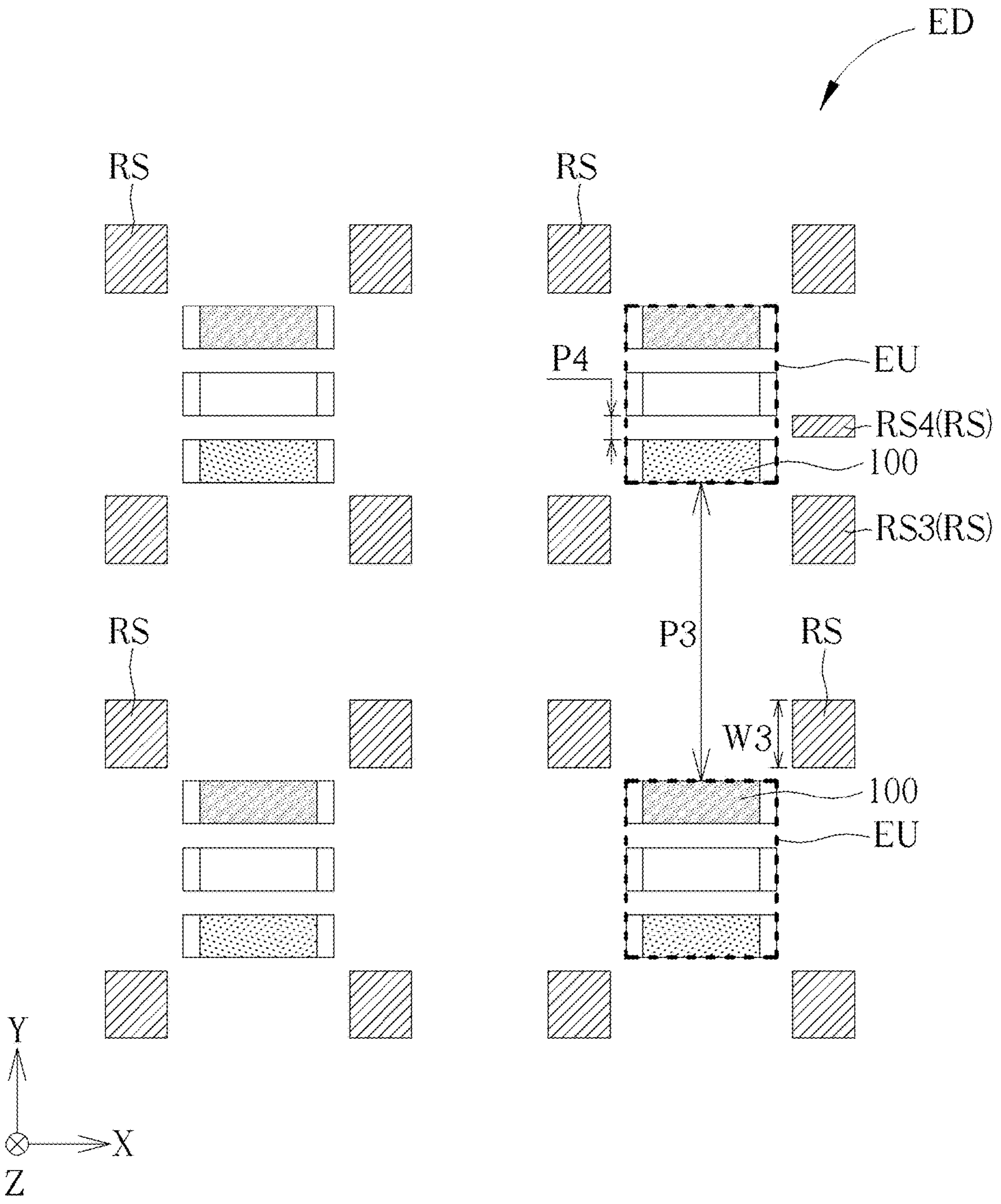
FIG. 8 is a top-view schematic diagram of an electronic device according to a fifth embodiment of the present disclosure.

Please refer to FIG. 8, which is a top-view schematic diagram of an electronic device according to a fifth embodiment of the present disclosure. According to an electronic device ED of the fifth embodiment shown in FIG. 8, the electronic device ED may be bent in the direction Y or subjected to stress or external force along the direction Y, for example. In the direction Y, a spacing P3 exists between two adjacent ones of the plurality of electronic units EU, and one of the plurality of reinforcing structures RS has a width W3, wherein a ratio of the width W3 to the spacing P3 is greater than or equal to 0.7 and less than or equal to 2.5 (i.e., $0.7\leq W3/P3\leq 2.5$). The selected reinforcing structure RS described above is adjacent to at least one of the selected electronic units EU, and the maximum width of the above reinforcing structure RS in the direction Y is the width W3. According to the design of the above ratio, the probability of damage of the electronic elements 100 may be effectively reduced. In some embodiments, the above ratio of the width W3 to the spacing P3 may be greater than or equal to 1 and less than or equal to 2 (i.e., $1\leq W3/P3\leq 2$). In other embodiments, the electronic device ED may be bent in the direction X or subjected to stress or external force along the direction X, and at this time the spacing P3 and the width W3 described above may be measured in the direction X, which will not be described redundantly herein.

As shown in FIG. 8, in some embodiments, in the direction Y, a spacing P3 exists between two adjacent electronic elements 100, and a spacing P4 exists between further two adjacent electronic elements 100. When the spacing P3 is greater than the spacing P4, one of the plurality of reinforcing structures RS3 is disposed adjacent to the two adjacent electronic elements 100 having the spacing P3 and has an area A3, and another one of the plurality of reinforcing structures RS4 is disposed adjacent to the further two adjacent electronic elements 100 having the spacing P4 and has an area A4, wherein the area A3 is greater than the area A4. The area A3 and the area A4 are the areas obtained in the top-view along the direction Z respectively.

Figure 9:
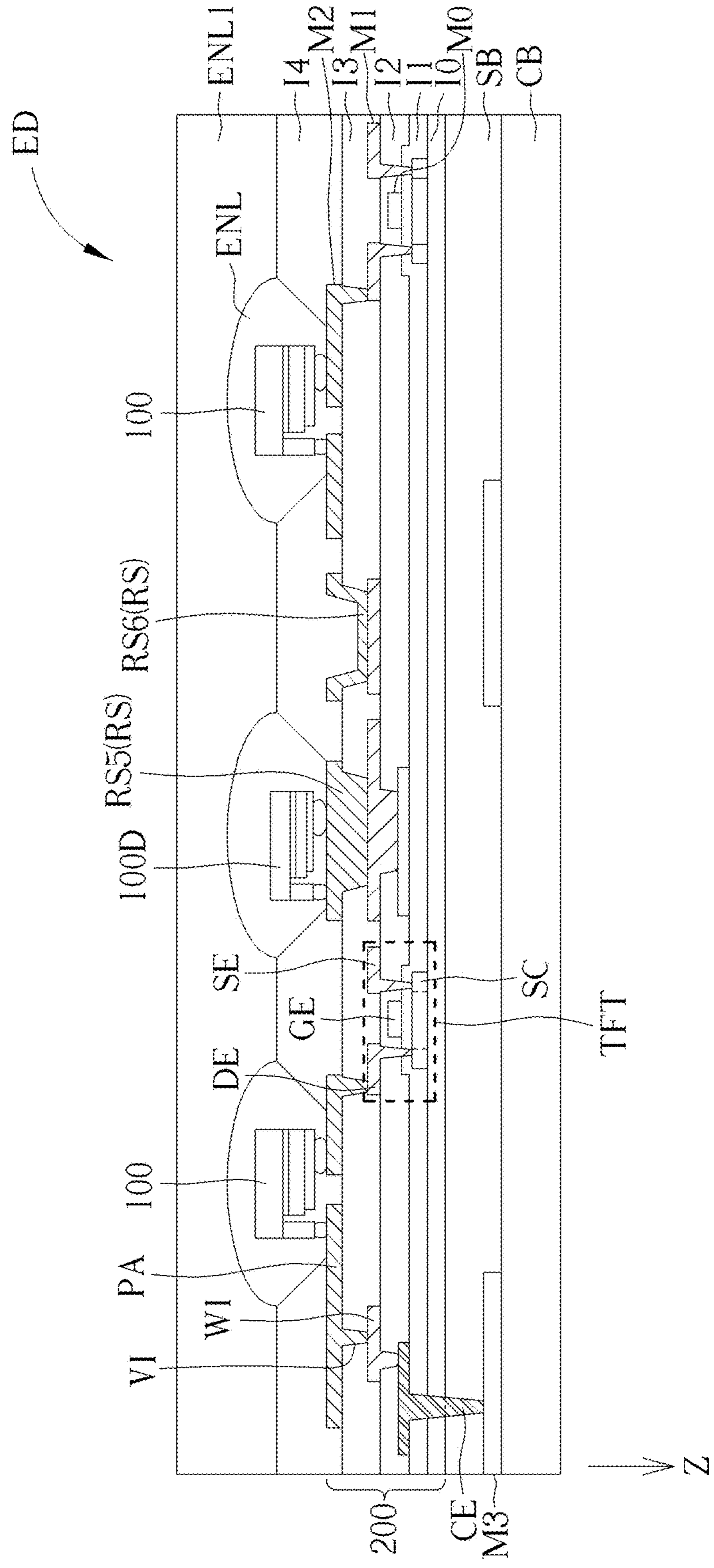
FIG. 9 is a partial cross-sectional schematic diagram of an electronic device according to a sixth embodiment of the present disclosure.

Please refer to FIG. 9, which is a partial cross-sectional schematic diagram of an electronic device according to a sixth embodiment of the present disclosure. According to an electronic device ED of the sixth embodiment shown in FIG. 9, at least one of the plurality of reinforcing structures RS may be disposed between two adjacent electronic elements 100, and the plurality of reinforcing structures RS may include a reinforcing structure RS5, for example. The reinforcing structure RS5 may be formed by stacking a portion of each of the conductive layers in the circuit layer 200, and the conductive layer located at the uppermost layer in the reinforcing structure RS5 may be coplanar with the conductive pads PA connected to the electronic elements 100. For example, the reinforcing structure RS5 and the conductive pads PA may be formed by the same conductive layer M2. FIG. 9 shows that the reinforcing structure RS5 is formed by stacking three conductive layers (such as the conductive layer M0, the conductive layer M1 and the conductive layer M2) as an example, but the number of the conductive layers forming the reinforcing structure RS5 in the present disclosure is not limited to the above. In some embodiments, the electronic device ED may further include a dummy electronic element 100D, the dummy electronic element 100D may be disposed on one of the reinforcing structures RS (e.g., the reinforcing structure RS5), and may be used for testing the electronic device ED or repairing abnormal conditions, for example. In other embodiments, the plurality of reinforcing structures RS may include a reinforcing structure RS6, and the reinforcing structure RS6 may be formed of a portion of the conductive layer (e.g., the conductive layer M2) in the circuit layer 200 and may have a recess on the surface thereof, wherein a portion of the reinforcing structure RS6 may be coplanar with the conductive pads PA connected to the electronic elements 100. In some embodiments, the plurality of reinforcing structures RS may be formed of a portion of at least one conductive layer in the circuit layer 200 disposed on the flexible substrate. In further embodiments, one of the plurality of reinforcing structures RS may be a convex structure (not shown) formed of a non-metal material or insulating material.

As shown in FIG. 9, in some embodiments, the electronic device ED may further include a circuit board CB and a connecting element CE. The circuit board CB may be disposed on a side of the flexible substrate SB opposite to the circuit layer 200, and the connecting element CE may extend and penetrate through at least one insulating layer (e.g., the insulating layer I1 and the insulating layer I0) in the circuit layer 200 and the flexible substrate SB, and at least one of the electronic elements 100 may be electrically connected to the circuit board CB through the connecting element CE. The connecting element CE may include conductive material, such as (but not limited to) copper, aluminum, titanium, gallium, tantalum, other suitable materials or combinations of the above materials. For example, the electronic element 100 may be electrically connected to the circuit board CB through the conductive layer M2, the conductive layer M1, the connecting element CE and a conductive layer M3 which is disposed on the circuit board CB, but not limited herein.

Figure 10:
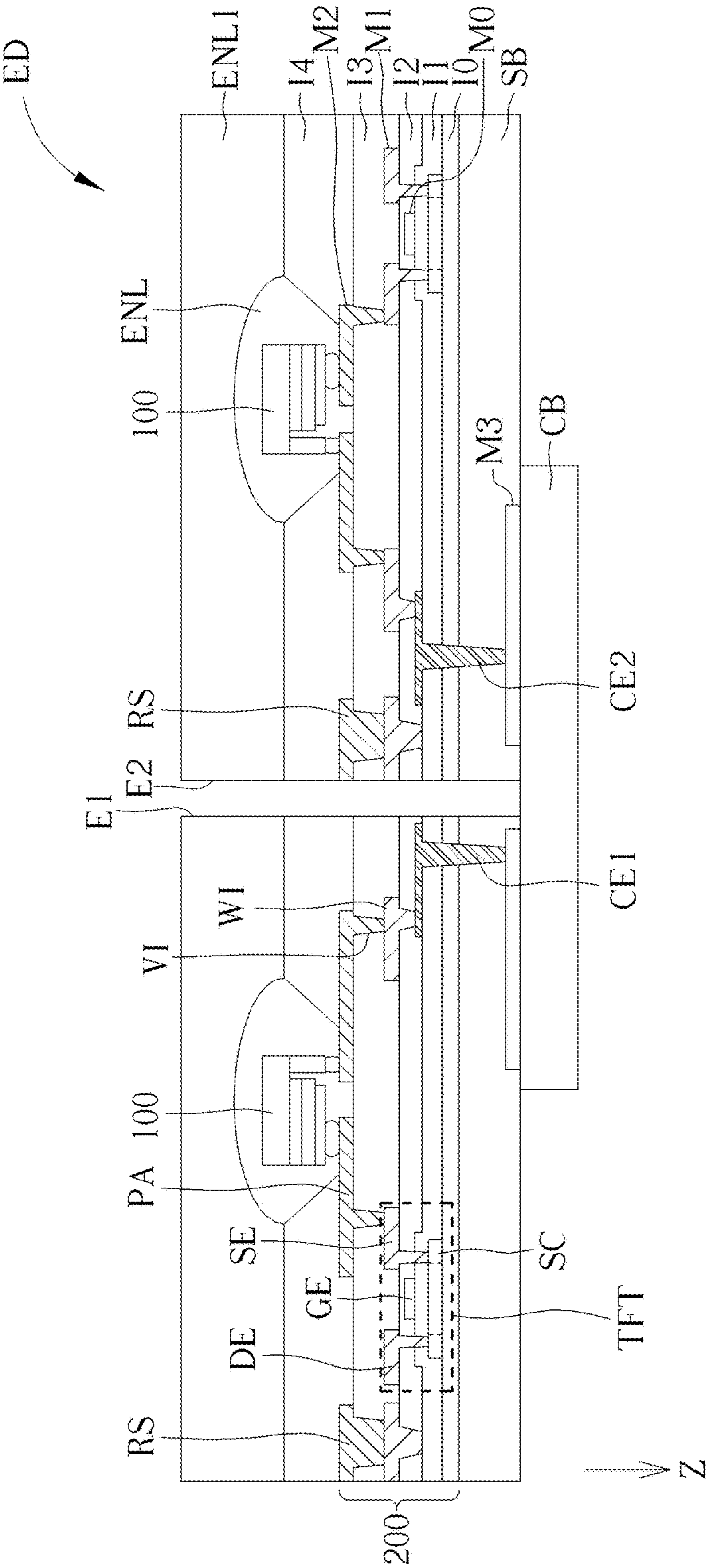
FIG. 10 is a partial cross-sectional schematic diagram of an electronic device according to a seventh embodiment of the present disclosure.

Please refer to FIG. 10, which is a partial cross-sectional schematic diagram of an electronic device according to a seventh embodiment of the present disclosure. According to an electronic device ED of the seventh embodiment shown in FIG. 10, the electronic device ED may further include a circuit board CB, a connecting element CE1 and a connecting element CE2, and the electronic device ED has an end E1 and an end E2 which are opposite to each other. For example, the end E1 and the end E2 may be located on opposite left and right sides when the electronic device ED is not bent, and the end E1 and the end E2 may be adjacent to each other when the electronic device ED is bent into a cylindrical shape. The connecting element CE1 and the connecting element CE2 may include conductive material, such as (but not limited to) copper, aluminum, titanium, gallium, tantalum, other suitable materials or combinations of the above materials. The detailed structures of other layers and elements included in the electronic device ED may be referred to any one of the electronic devices ED of the previous embodiments, which will not be described redundantly herein. The circuit board CB may be disposed on a side of the flexible substrate SB opposite to the circuit layer 200. The connecting element CE1 may be disposed close to the end E1 and may extend and pass through at least one insulating layer (e.g., the insulating layer I1 and the insulating layer I0) in the circuit layer 200 and the flexible substrate SB, and a portion of the plurality of electronic elements 100 may be electrically connected to the circuit board CB through the connecting element CE1. For example, a portion of the electronic elements 100 may be electrically connected to the circuit board CB through the conductive layer M2, the conductive layer M1, the connecting element CE1 and a portion of the conductive layer M3 which is disposed on the circuit board CB. Furthermore, the connecting element CE2 may be disposed close to the end E2 and may extend and pass through at least one insulating layer (e.g., the insulating layer I1 and the insulating layer I0) in the circuit layer 200 and the flexible substrate SB, and another portion of the plurality of electronic elements 100 may be electrically connected to the circuit board CB through the connecting element CE2. For example, another portion of the electronic elements 100 may be electrically connected to the circuit board CB through the conductive layer M2, the conductive layer M1, the connecting element CE2 and another portion of the conductive layer M3 which is disposed on the circuit board CB. Through the above structural design, the circuit board CB may transmit signals through dual-directions to the plurality of electronic elements 100 through the connecting element CE1 and the connecting element CE2 respectively, such as (but not limited to) transmitting signals to odd-numbered rows of electronic units EU and even-numbered rows of electronic units EU through the connecting element CE1 and the connecting element CE2 respectively, such that the electronic device ED may be driven through dual-sides. However, the electronic device ED shown in FIG. 10 is not limited to the above. In other embodiments, the structure of the electronic device ED shown in FIG. 10 may be a tiled electronic device and may not be bent.

From the above description, according to the electronic devices of the embodiments of the present disclosure, through the design of arrangement locations of the electrical connection holes and/or disposing the reinforcing structures, the probability of damage or fracture of the electrical connection holes may be reduced and/or the probability of damage of electronic elements may be reduced, thereby improving the reliability of the electronic device. In addition, through the shifting design of the electronic units, the wire-easy-to-break area may be dispersed, such that the probability of wire breakage and/or expanding of the fracture range of the wire is reduced.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:

a flexible substrate;

a plurality of electronic elements disposed on the flexible substrate, wherein three adjacent ones of the plurality of electronic elements are arranged as a group to form an electronic unit such that the plurality of electronic elements form a plurality of electronic units, and four adjacent ones of the plurality of electronic units form a unit region that is quadrilateral;

a plurality of wires disposed on the flexible substrate; and a plurality of electrical connection holes disposed on the flexible substrate, wherein a density of the electrical connection holes in a peripheral portion of the unit region is greater than a density of the electrical connection holes in a central portion of the unit region;

wherein the plurality of electrical connection holes are disposed adjacent to the plurality of electronic elements; and wherein in a direction, a shortest distance between one of the plurality of electronic units and an adjacent one of the plurality of electrical connection holes is defined as a first distance, and a shortest distance between the one of the plurality of electronic units and another one of the plurality of electronic units adjacent to the one of the plurality of electronic units is defined as a second distance, wherein the first distance is less than or equal to two thirds of the second distance.

2. The electronic device according to claim 1, wherein the plurality of electronic elements are electrically connected to the plurality of wires through at least one of the plurality of electrical connection holes respectively.

3. The electronic device according to claim 1, wherein the plurality of electronic units comprises a first electronic unit and a second electronic unit, the first electronic unit and the second electronic unit are adjacent to each other in a first direction and have an shifting distance in a second direction, wherein the second direction is perpendicular to the first direction, and the first electronic unit has a first length in the second direction, wherein the shifting distance is greater than or equal to 0.2 times of the first length and less than or equal to 0.5 times of the first length.

4. The electronic device according to claim 3, wherein in the second direction, the plurality of electronic elements of the first electronic unit has a second length respectively, and a spacing exists between two adjacent ones of the plurality of electronic elements of the first electronic unit, wherein the shifting distance is not equal to N times of a sum of the second length and the spacing, and N is a positive integer.

5. The electronic device according to claim 1, further comprising a plurality of reinforcing structures disposed on the flexible substrate, wherein the plurality of reinforcing structures are disposed adjacent to at least one of the plurality of electronic elements respectively.

6. The electronic device according to claim 5, wherein the plurality of reinforcing structures comprises a first reinforcing structure having an extending portion and a protruding portion protruding from the extending portion, an extension direction of the extending portion is parallel to a long-axis direction of one of the plurality of electronic elements.

7. The electronic device according to claim 5, wherein in a direction, a first spacing exists between two adjacent ones of the plurality of electronic elements, and a second spacing exists between further two adjacent ones of the plurality of electronic elements, wherein when the first spacing is greater than the second spacing, one of the plurality of reinforcing structure disposed adjacent to the two adjacent ones of the plurality of electronic elements has a first width, another one of the plurality of reinforcing structure disposed adjacent to the further two adjacent electronic elements has a second width, and the first width is greater than the second width.

8. The electronic device according to claim 5, further comprising an extension metal line disposed on the flexible substrate, wherein the plurality of reinforcing structures comprises a second reinforcing structure in contact with the extension metal line.

9. An electronic device, comprising:

a flexible substrate;

a plurality of reinforcing structures disposed on the flexible substrate, wherein extension lines of outer edges of at least two of the plurality of reinforcing structures form a first region; and a plurality of electronic elements disposed on the flexible substrate, wherein three adjacent ones of the plurality of electronic elements form a second region, and the first region is overlapped with the second region, wherein an area ratio of the first region to the second region is greater than 1 and less than or equal to 9.

10. The electronic device according to claim 9, wherein in a top-view, a ratio of an area of one of the plurality of reinforcing structures to an area of one of the plurality of electronic elements is greater than or equal to 0.15 and less than or equal to 3.

11. The electronic device according to claim 9, wherein three adjacent ones of the plurality of electronic elements are arranged as a group to form an electronic unit, such that the plurality of electronic elements form a plurality of electronic units, wherein in a direction, a spacing exists between two adjacent ones of the plurality of electronic units, and one of the plurality of reinforcing structures has a width, wherein a ratio of the width to the spacing is greater than or equal to 0.7 and less than or equal to 2.5.

12. The electronic device according to claim 9, wherein in a direction, a first spacing exists between two adjacent ones of the plurality of electronic elements, and a second spacing exists between further two adjacent ones of the plurality of electronic elements, wherein when the first spacing is greater than the second spacing, one of the plurality of reinforcing structures is disposed adjacent to the two adjacent ones of the plurality of electronic elements and has a first area, another one of the plurality of reinforcing structures is disposed adjacent to the further two adjacent ones of the plurality of electronic elements and has a second area, and the first area is greater than the second area.

13. The electronic device according to claim 9, wherein the plurality of reinforcing structures are formed of a portion of at least one conductive layer in a circuit layer disposed on the flexible substrate.

14. The electronic device according to claim 13, wherein the circuit layer comprises a conductive pad electrically connected to one of the plurality of electronic elements, and the plurality of reinforcing structures are coplanar with the conductive pad.

15. The electronic device according to claim 13, wherein the circuit layer comprises a first conductive layer and a second conductive layer disposed between the first conductive layer and the flexible substrate, wherein one of the plurality of reinforcing structures is formed of the first conductive layer and has a first thickness, the second conductive layer has a second thickness, and the first thickness is greater than the second thickness.

16. The electronic device according to claim 9, further comprising a plurality of electrical connection holes disposed on the flexible substrate, wherein the plurality of electrical connection holes are disposed adjacent to one of the plurality of reinforcing structures respectively.

17. The electronic device according to claim 9, further comprising a dummy electronic element disposed on one of the plurality of reinforcing structures.

18. The electronic device according to claim 9, wherein the second region is located within the first region.

* * * * *